(12) United States Patent
Chapman

(10) Patent No.: US 7,148,090 B2
(45) Date of Patent: Dec. 12, 2006

(54) METHOD OF FABRICATING A TFT DEVICE FORMED BY PRINTING

(75) Inventor: Jeffrey A. Chapman, Burgess Hill (GB)

(73) Assignee: Koninklijke Philps Electronics N. V., Eindhoven (NL)

( * ) Notice: Subject to any disclaimer, the term of this patent is extended or adjusted under 35 U.S.C. 154(b) by 0 days.

(21) Appl. No.: 10/540,411

(22) PCT Filed: Dec. 11, 2003

(86) PCT No.: PCT/IB03/06039

§ 371 (c)(1),
(2), (4) Date: Jun. 24, 2005

(87) PCT Pub. No.: WO2004/059718

PCT Pub. Date: Jul. 15, 2004

(65) Prior Publication Data

US 2006/0094174 A1  May 4, 2006

(30) Foreign Application Priority Data

Dec. 24, 2002  (GB) .................................. 0230129.9

(51) Int. Cl.
*H01L 21/00* (2006.01)
*H01L 21/84* (2006.01)

(52) U.S. Cl. ....................... 438/149; 438/151; 438/942; 101/327; 101/328; 101/329; 257/E21.372

(58) Field of Classification Search ................ 438/149, 438/151, 942; 101/327–329
See application file for complete search history.

(56) References Cited

U.S. PATENT DOCUMENTS

| 5,130,829 A | 7/1992 | Shannon | |
|---|---|---|---|
| 2002/0187592 A1 * | 12/2002 | Wong | ........................ 438/149 |

FOREIGN PATENT DOCUMENTS

| EP | 0 471 628 A | 2/1992 |
|---|---|---|
| EP | 0471628 A1 * | 2/1992 |
| JP | 60133758 A * | 7/1985 |

* cited by examiner

*Primary Examiner*—Michael Lebentritt
*Assistant Examiner*—Mohsen Ahmadi

(57) ABSTRACT

A thin-film transistor for an active matrix display is fabricated using printing means, such as a gravure offset printer. First and second pattern layers ($25_1$, $25_2$; 30) are formed on a layer structure (4) wherein at least one of the layers is printed. The printed layers ($25_1$, $25_2$; 30) mask regions ($27_1$, $27_2$, 28) for defining source a and drain terminals. The second pattern layer (28) can be removed so as to allow etching of the second region (28) for defining a channel.

20 Claims, 7 Drawing Sheets

METHOD OF FABRICATING A TFT DEVICE FORMED BY PRINTING

The invention relates to a method of fabricating a device, particularly although not exclusively to a method of fabricating a thin-film transistor (TFT).

TFTs are widely used in liquid crystal and other flat panel displays, including active matrix LCDs, to control or sense the state of each pixel in the display. One common TFT structure, known as a bottom gate TFT (BGTFT), is described in U.S. Pat. No. 5,130,829. In this structure, a gate terminal is provided on an insulating substrate, such as an aluminosilicate glass and overlaid with layers of insulating material, e.g. silicon nitride (SiN), and semiconducting materials, e.g. intrinsic and n+ doped hydrogenated amorphous silicon (a-Si:H). Metal source and drain terminals are then formed over the a-Si:H layer and part of the n+ doped layer, i.e. the portion in a region extending between these terminals, is removed.

This TFT structure is formed by the successively depositing layers of different materials. A generally horizontally disposed transistor may be produced using photolithography to define its source and drain terminals and channel length. Following the deposition of the insulator and semiconductor layers, the substrate is coated with one or more metalisation layers and covered with a photopolymer material, or positive photoresist. The photoresist contains a photoactive additive that acts as a dissolution inhibitor and also absorbs light at one or more particular wavelengths, for example, light in the ultra-violet (UV) waveband. A photomask having a pattern of areas that are transparent and opaque to UV light is placed between the substrate and a UV light source and the photoresist is illuminated. On those parts of the substrate aligned with a transparent area of the photomask pattern, UV photons are absorbed at the top surface of the photoresist. The photoactive additive undergoes a photochemical reaction so that it no longer acts as a dissolution inhibitor. In addition, the UV photons bleach the exposed photoresist so that the light can pass through and cause reactions deeper in the photoresist layer. Therefore, the photochemical reactions proceed through the photoresist layer in a "top-down" manner. The opaque areas in the photomask pattern act to shield parts of the photoresist layer from the UV light, so that these photochemical reactions do not occur.

The exposed portions of the photoresist layer, where the photoactive additive no longer inhibits dissolution, are removed using a developer solution and the substrate may be cured by heating. This process leaves portions of the photoresist layer in one or more locations on the substrate corresponding to the opaque areas of the photomask pattern.

The remaining portions of the photoresist layer are used as a mask in an etching process, in which exposed sections of the metalisation layer and the corresponding portions of underlying semiconductor layers are removed in order to define the source and drain electrodes. However, it may be necessary to etch more than one pattern into the layers covering the substrate. For example, edges of the source and drain terminal may be defined by discarding portions of the metalisation and semiconductor layers, while the channel is defined using a separate etching process, where a portion of the metalisation layer is discarded followed by partial removal of the underlying semiconductor layer. This can be achieved using two separate photomasks and repeating the light exposure, development and etching steps. However, such a method is wasteful, as it requires the provision and removal of two photoresist layers, and increases the costs and complexity of the manufacturing process. In particular, precise alignment of the second photomask and substrate is essential.

An alternative approach used in the manufacture of semiconductor devices employs a half-tone, or grey-tone, photomask, where a single photomask configured with a pattern of transparent, opaque and half-tone, or grey-tone, areas is used. The half-tone areas partly attenuate the light passing through them. As in the process described above, the full thickness of the photoresist underlying transparent areas of the photomask is exposed and removed at the development stage, while the opaque areas of the photomask shield other parts of the substrates from the light, leaving portions of the photoresist at full thickness. As the reactions between the photoresist and the UV light proceed in a "top-down" manner, parts of the photoresist layer aligned with a half-tone area are only partially exposed, i.e. the photochemical reactions have occurred in only the uppermost part of the photoresist layer. This produces photoresist portions that, after development, are thin in comparison to the unexposed photoresist portions. Therefore, photoresist portions with two or more different thicknesses are formed on the substrate in a single light exposure and development process.

The exposed portions of the metalisation layer and semiconductor layers are then etched in a first pattern, defined by full and reduced thickness photoresist, after which a resist dry etching step may be used to uniformly reduce the thickness of the remaining photoresist portions. This thinning procedure completely removes the photoresist portions that were defined using the half-tone portions of the mask but leaves thinned portions of the photoresist layer in those regions that were aligned with the opaque areas of the mask. A second pattern is then etched in the newly exposed sections of the substrate.

The present invention seeks to provide an alternative method of fabricating a device.

According to a first aspect of the present invention there is provided a method of fabricating a device, the method comprising providing a layer structure, forming a first patterned layer onto a surface of the layer structure so as to mask a first region of the surface, forming a second patterned layer onto the surface layer of the layer structure so as to mask a second region of the surface and to leave unmasked a third region of the surface, etching the layer structure in the third region and either removing the second patterned layer and etching the layer structure in the second region or removing the first patterned layer and etching the layer structure in the first region, wherein at least one of said first or second patterned layers is formed by printing.

Printing a patterned layer onto a surface may be understood as meaning selectively applying the patterned layer to the surface, for example by pressing it onto the surface.

In a preferred embodiment, both of the first and second patterned layers are formed by printing.

The printing of the second patterned layer may comprise overlapping the second patterned layer with at least a portion of the first patterned layer. The printing of the second patterned lay may occur substantially immediately following the printing of the first layer. The term "immediately" may be understood as meaning within a few seconds or a few tens of seconds. It may be understood as meaning as soon as the first patterned layer has dried.

The method may comprise printing the first patterned layer having a first thickness and printing the second patterned layer having a second, different thickness. The method may comprise using a first ink for printing the first patterned layer and using a second ink for printing the second patterned layer. The first and second inks may be different and may be diluted to different concentrations.

According to a second aspect of the present invention there is provided a method of fabricating a thin-film transistor according to the method. The method may further comprise providing a substrate, providing a patterned conductive gate region on the substrate, providing a dielectric layer overlying the substrate and the patterned conductive gate region, providing a first semiconductor layer overlying the dielectric layer, providing a second semiconductor layer overlying the first semiconductor layer and providing a metalisation layer overlying the second semiconductor layer.

The printing of the first layer may include defining regions for forming source and drain terminals.

According to a third aspect of the present invention there is provided apparatus configured to perform the method.

According to a fourth aspect of the present invention there is provided apparatus for fabricating a thin-film transistor comprising printing means, the printing means configured to print a first patterned layer on a layer structure and a second, different patterned layer on a layer structure, etching means, the etching means configured to etch the layer structure, and removing means, said removing means configured to remove the first patterned layer and to leave at least part of the second patterned layer.

A layer structure may comprise a single layer or a plurality of layers.

Embodiments of the present invention will now be described by way of example with reference to the accompanying drawings in which.

Figure 1:
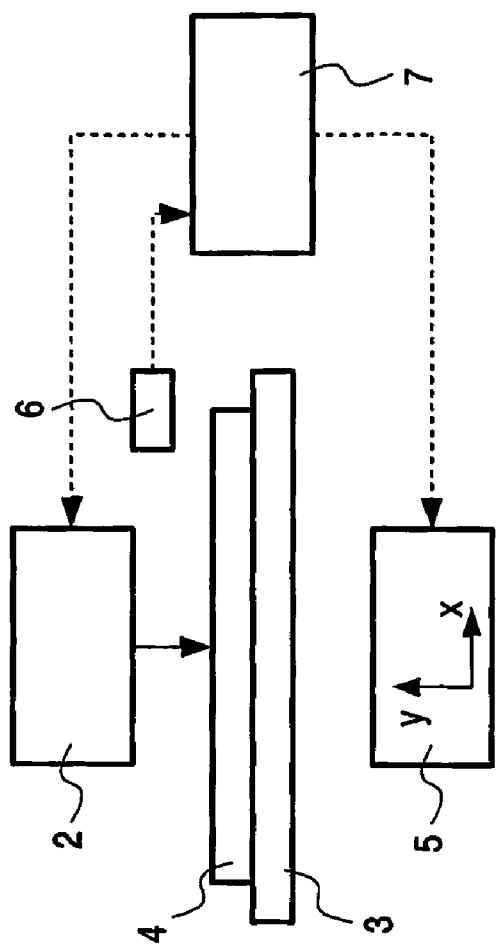
FIG. 1 is a schematic diagram of apparatus for fabricating a device using a method according to the present invention.

Referring to FIG. 1, apparatus 1 for fabricating a device, such as a thin-film transistor, includes printing means 2, in this example a gravure offset printer, means 3 for supporting a layer structure 4, in this example a rigid stage, means 5 for moving the printing means 2 relative to the layer structure 4, in this example electrical motors, means 6 for detecting position of the printing means 2 relative to the layer structure 4, in this example an optical microscope and digital camera, and means 7 for controlling the printing means 2 and moving means 5, in this example a programmed general-purpose computer. The apparatus 1 also includes etching means 8, in this example a dry etcher. The etching means 8 may also include removing means for removing printed layers.

Figure 2A:
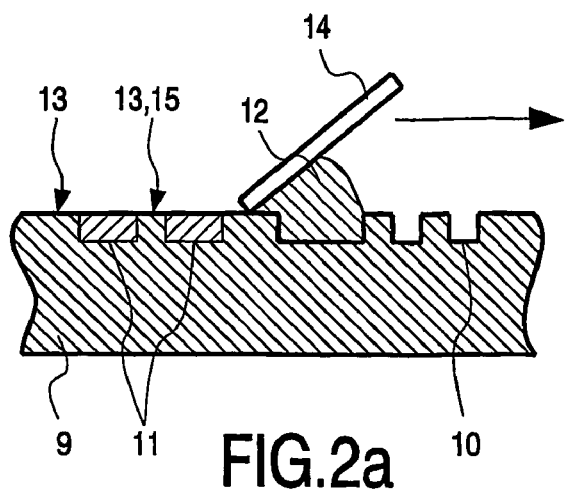
FIGS. 2a, 2b and 2c illustrate the steps in gravure offset printing.

In this example, the printing means 2 is arranged to print two patterned layers in succession. In this example, an offset printing process is used and printing of each layer generally comprises three steps:

Referring to FIG. 2a, a first step comprises inking. An image carrying means 9, in this example a cliché in the form of a glass plate, includes a plurality of grooves 10 which are arranged to define an image 11. Ink 12 is applied to the surface 13 of the image carrying means 9 and a filling means 14, which is often referred to as a doctor blade and which in this example is a metal blade, is passed over the surface 13 of the image carrying means 9 so as to fill the grooves 10 with ink 12, and clear ink 12 from regions 15 between the grooves 10.

Figure 2B:
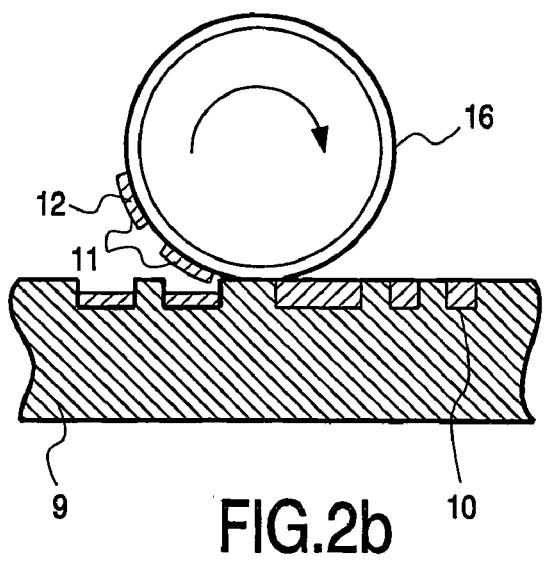

Referring to FIG. 2b, a second step comprises transferring the image 11 from the image carrying means 9. Image transferring means 16, for example in the form of a cylindrical blanket comprising a polymer, fixed around a metal roller, is applied to the surface 13 of the image carrying means 9, in this example by rolling, so as to pick up at least some of the ink 12 in each groove 10. The image 11 is preserved on the image transferring means 15.

Figure 2C:
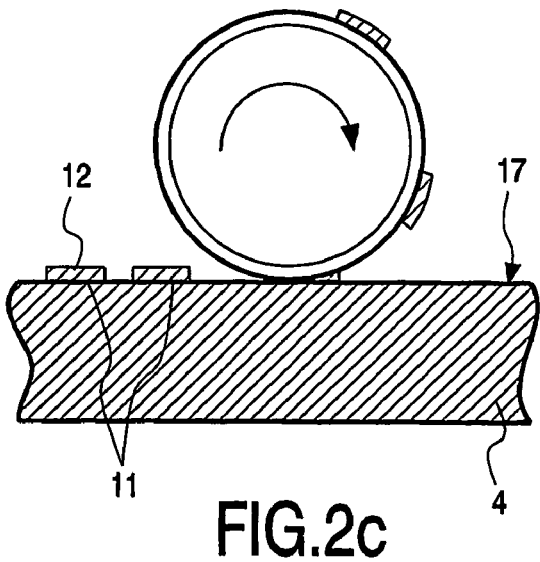

Referring to FIG. 2c, a third step comprises printing the image 11. The image transferring means 15 carrying ink 12 is applied, for example by rolling, to a surface 17 of the layer structure 4. Thus, ink 12 is transferred from the image transferring means 15 onto the surface 17 of the layer structure 4.

Preferably, gravure offset printing is used because it has the advantage that it can be arranged as a continuous process so allowing high throughput. Nevertheless, other types of printing may be used such as screen or inkjet printing.

Figure 3:
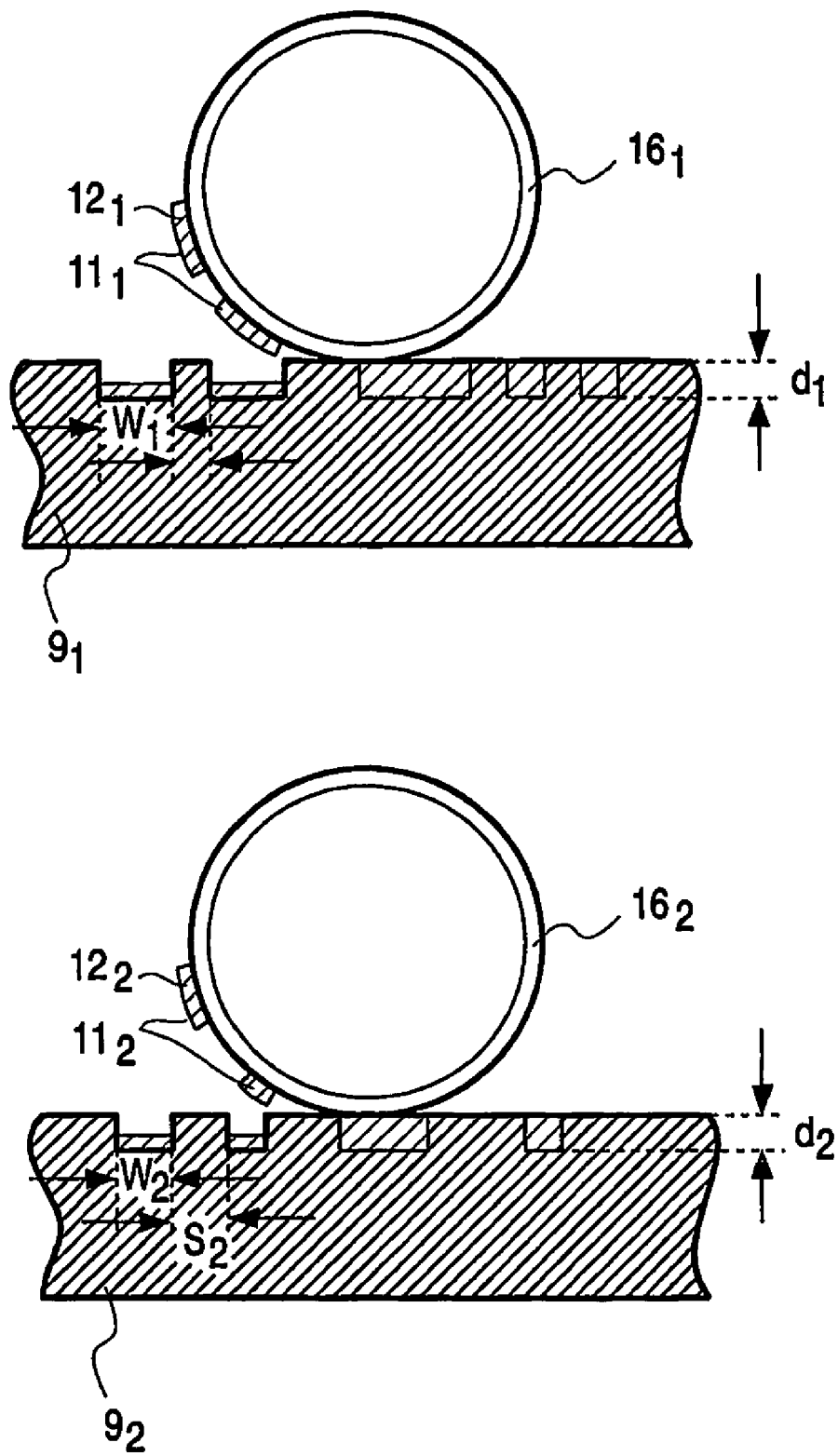
FIG. 3 shows a two-stage inking process.

Referring to FIG. 3, the printing means 2 includes two different images carrying means $9_1$, $9_2$, for two different images $11_1$, $11_2$ and two different image transferring means $16_1$, $16_2$.

The first and second image carrying means $9_1$, $9_2$ include respective sets of grooves $10_1$, $10_2$ having first and second groove depths $d_1$, $d_2$ respectively. In this example, the first and second groove depths $d_1$, $d_2$ are of the order of 1 or 10 μm.

By selecting groove depth $10_1$, $10_2$ and/or different ink concentrations, solvents or composition, the thickness of ink applied to a layer structure may be controlled and varied.

Line widths $w_1$, $w_2$ and line separations $s_1$, $s_2$ of the order of 5 μm may be achieved.

The inks $12_1$, $12_2$ are resistant to wet and/or dry etching or have substantial selectivity over the material being etched so as to provide an etch mask. Preferably, when dry, each ink $12_1$, $12_2$ has a thickness of the order of 1 or 10 μm. Preferably, each ink $12_1$, $12_2$ is soluble in a volatile solvent for quick drying so as to allow plural layers to be printed in succession. Preferably each ink $12_1$, $12_2$ is soluble in a different solvent. The inks $12_1$, $12_2$ preferably allow transfer of an image to the surface of the layer structure without distortion of the image, for example due to unpredicted an/or uncontrollable flow of the wet or dry ink. For example, the ink may be a resin/solvent mix. Alternatively, a conventional optical resist, or constituents thereof, may be used as an ink $12_1$, $12_2$. An epoxide amine cured system may be used. It will be appreciated by those skilled in the art that inks with these properties may be found by routine trial and experiment.

Figure 4A:
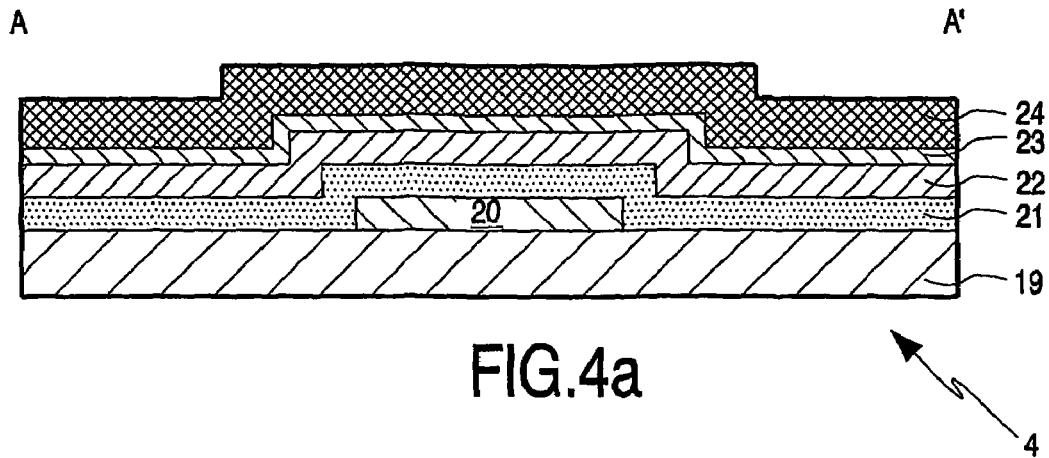
FIGS. 4a to 4i are cross-sectional views of a device at stages during fabrication.
Figure 5A:
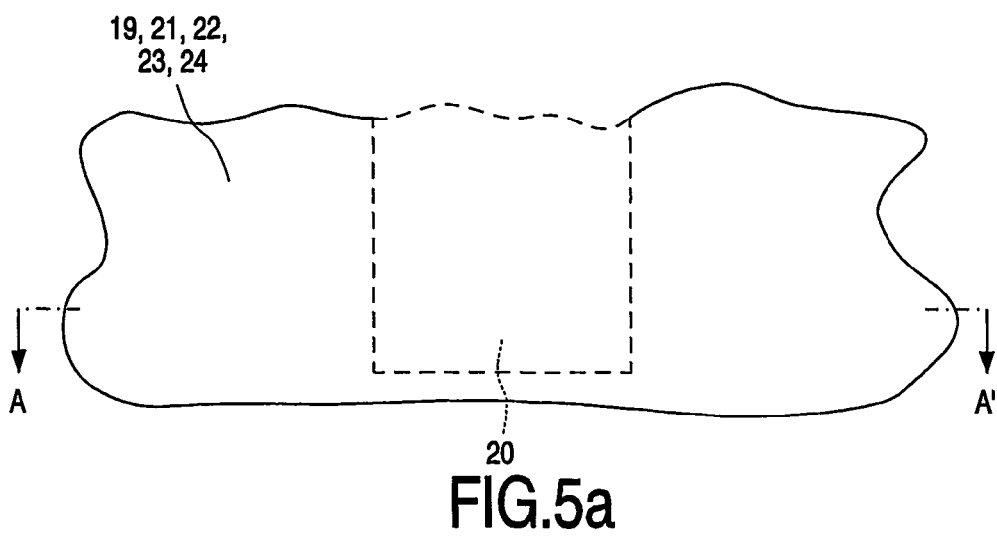
FIGS. 5a, 5b and 5c show a device in plan view during the stages of fabrication.

A process for defining the source, drain and channel terminals of a thin-film transistor will now be described:

Referring to FIGS. 4a and 5a, the layer structure 4 includes a substrate 19. In this example, the substrate 19 is transparent and electrically insulating and is formed from aluminosilicate glass. However, an opaque substrate may be used. A gate terminal 20 is provided on the substrate 19, in this example by depositing and patterning aluminium in a known manner.

Successive overlying layers 21, 22, 23, 24 are provided over the gate terminal 20 and substrate 19, for example using chemical vapour deposition (CVD) apparatus (not shown) and/or sputtering apparatus (not shown). A first overlying layer is a gate dielectric layer 21, in this example formed from silicon nitride ($S_3N_4$) and having a thickness of 300 nm. A second overlying layer is a semiconductor layer, in this example formed from undoped hydrogenated amorphous silicon (a-Si:H) and having a thickness of 200 nm. A third overlying layer is a semiconductor layer, in this example formed from n-type hydrogenated amorphous silicon (a-Si:H) doped with phosphorous (P) to a concentration of $5 \times 10^{20} \text{cm}^{-3}$ and having a thickness of 50 nm. Other layer thicknesses and doping concentrations may be used. A fourth overlying layer is a metalisation layer 24, in this example formed from molybdenum (Mo) preferably deposited by sputtering. Alternatively, it may be formed from chromium (Cr). The metalisation layer 24, in addition to a layer of Mo or Cr, may also include a layer of aluminium (Al) or aluminium-based alloy.

The layer structure 4 is placed on supporting means 3 (FIG. 1) ready for printing. The controlling means 7 (FIG. 1), aided by the detecting and moving means 6, 3 (FIG. 1), aligns the layer structure 4 to the printing means 2 (FIG. 1).

Figure 4B:
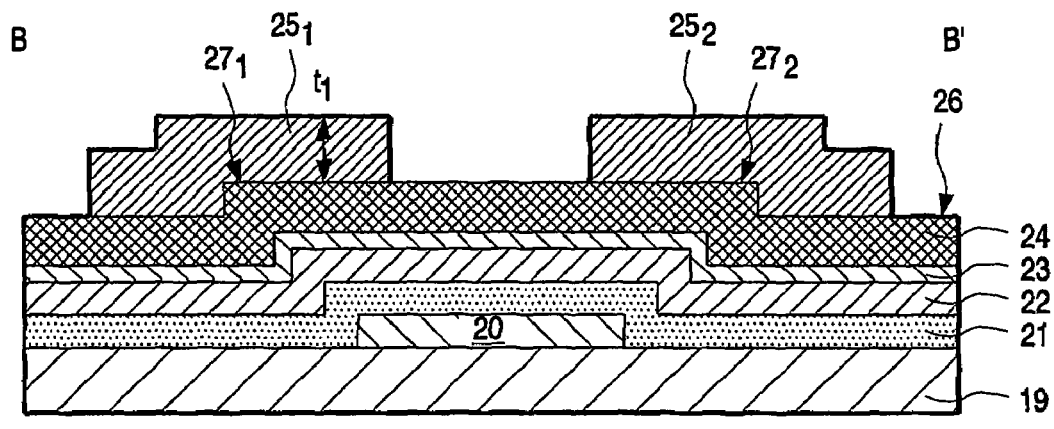
Figure 5B:
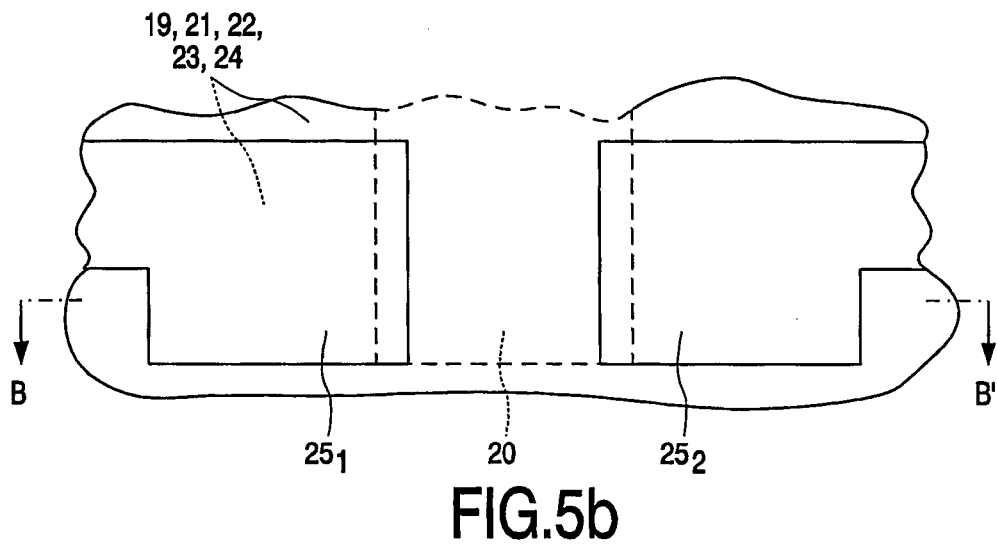

Referring to FIGS. 4b and 5b, a first patterned layer $25_1$, $25_2$ is printed onto a surface 26 of the layer structure 4, in this example by rolling the first transferring means $16_1$ (FIG. 3) over the layer structure 4, so as to mask first and second regions $27_1$, $27_2$ of the surface 26. In this example, the first patterned layer $25_1$, $25_2$ comprises an etch-resistant ink and has a dry thickness of 2 μm, i.e. $t_1 = 2$ μm.

Figure 4C:
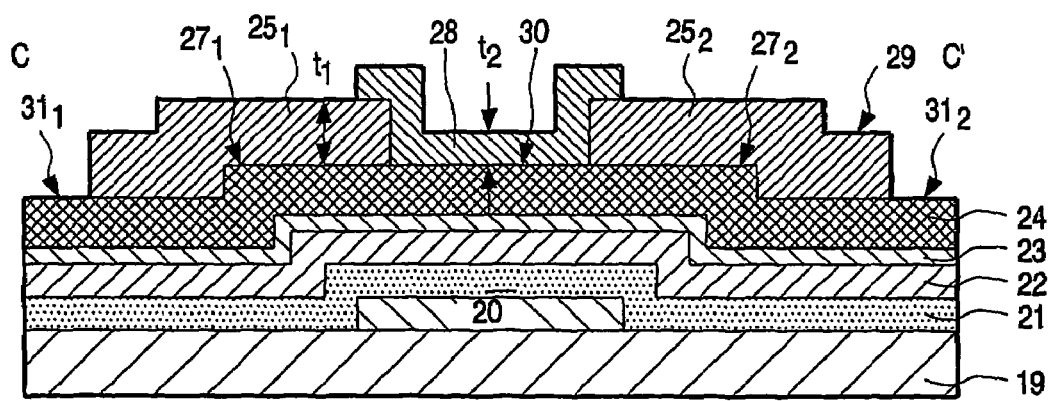
Figure 5C:
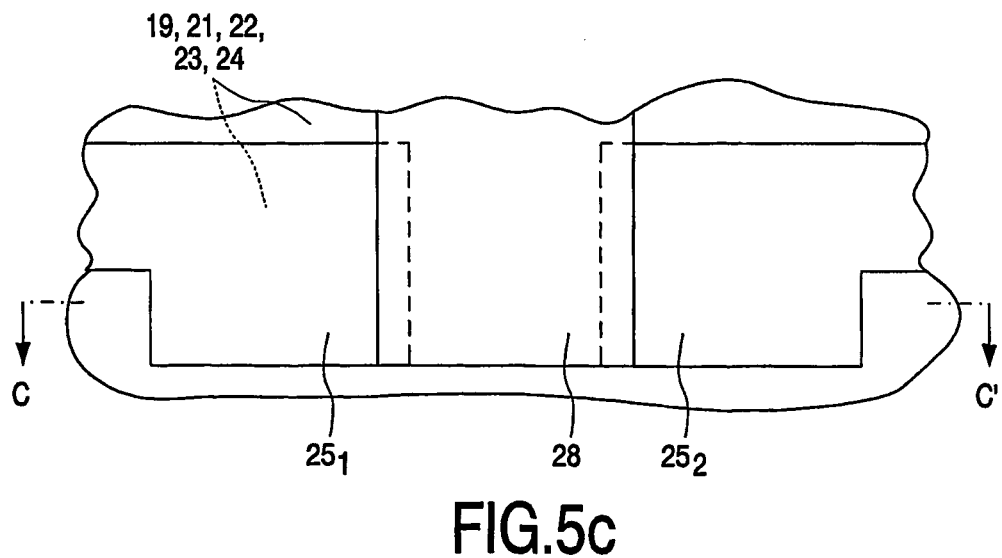

Referring to FIGS. 4c and 5c, a second pattern layer 28 is printed onto the surface 26 of the layer structure 4 and onto a surface 29 of the first patterned layer $25_1$, $25_2$ so as to cover a third region 30 of the surface 26 and to leave uncovered fourth and fifth regions $31_1$, $31_2$ of the surface 26. In this example, the second patterned layer 30 comprises an etch-resistant ink and has a thickness of 2 μm, i.e. $t_2 = 1$ μm.

In this example, the dry thickness $t_1$ of the first patterned layer $25_1$, $25_2$ is twice the dry thickness $t_2$ of the second patterned layer 28, i.e. $t_1 = 2 \times t_2$. However, the dry thickness $t_1$ of the first patterned layer $25_1$, $25_2$ may be equal to or greater than the dry thickness $t_2$ of the second patterned layer 28. The etch-resistant ink comprised in each of the first patterned layer $25_1$, $25_2$ and the second patterned layer 28 may also be different.

The layer structure 4 having layers $25_1$, $25_2$, 30 is transferred to the etching means 8 (FIG. 1) ready for etching.

Figure 4D:
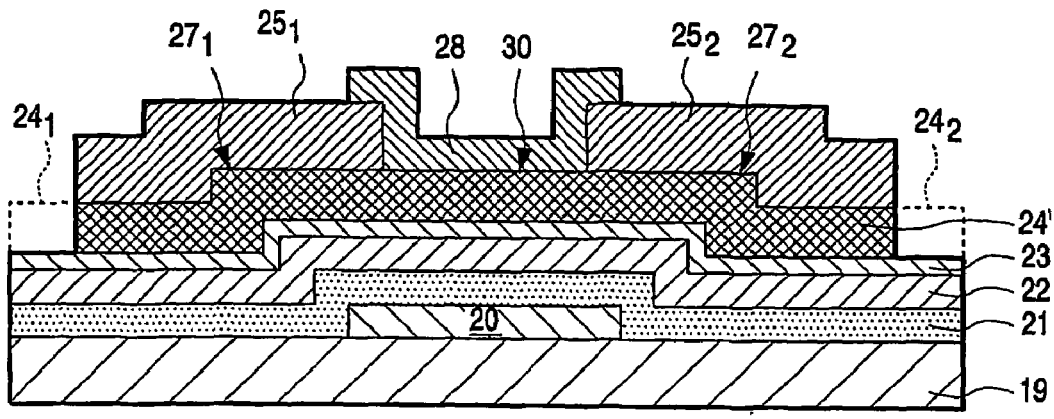

Referring to FIG. 4d, using a first dry etch, for example using $CF_4/O_2$ or $SF_6/O_2$, the layer structure 4 in the fourth and fifth regions $31_1$, $31_2$ is etched. The metalisation layer 24 in the fourth and fifth regions $31_1$, $31_2$ is etched until the second semiconductor layer 23 is reached, thereby removing first and second portions $24_1$, $24_2$ of the metalisation layer 24 and leaving etched metalisation layer 24'.

Figure 4E:
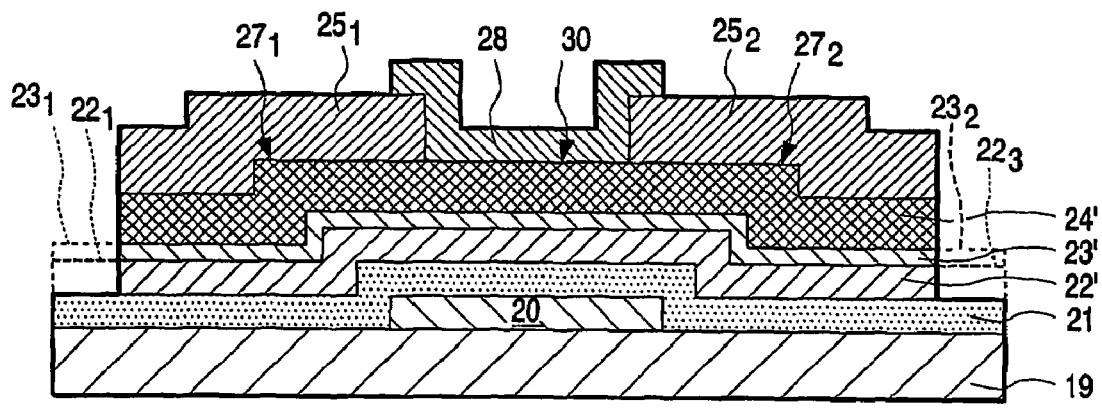

Referring to FIG. 4e, using a second dry etch, for example using $CF_4/O_2$ or $SF_6/O_2$, the layer structure 4 in the fourth and fifth regions $31_1$, $31_2$ is further etched. The second and first semiconductor layers 23, 22 in the fourth and fifth regions $31_1$, $31_2$ are etched until the dielectric layer 21 is reached, thereby removing first and second potions $23_1$, $23_2$ of the second semiconductor layer 23 and first and second potions $22_1$, $22_2$ of the first semiconductor layer 22 and leaving etched second and first semiconductor layers 23', 22'.

Figure 4F:
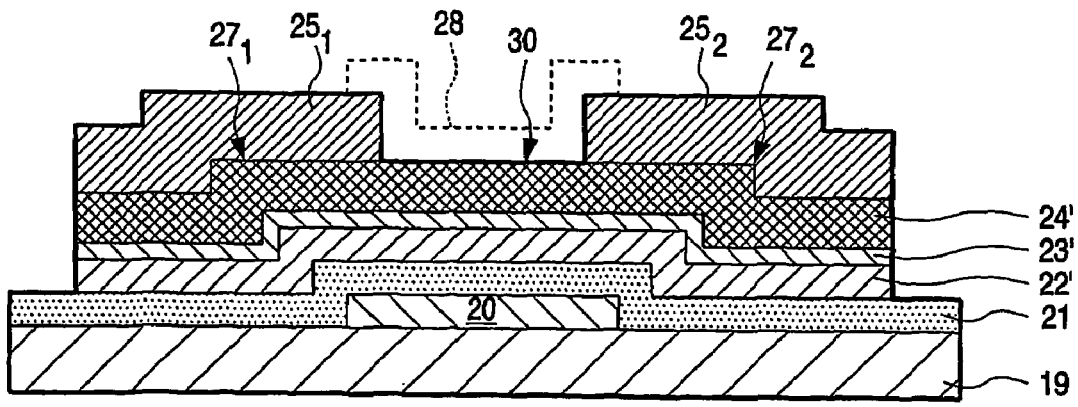

Referring to FIG. 4f, using a third dry etch, for example using $O_2$, the second patterned layer 28 is removed so as to leave uncovered the third region 30 of the surface 26. Alternatively, instead of the third dry etch, a solvent may be used to remove (by dissolving) the second patterned layer 28, but leave at least part of the first patterned layer $25_1$, $25_2$. This is preferred when the first and second patterned layers $25_1$, $25_2$, 28 comprise different inks which are soluble in different solvents.

Figure 4G:
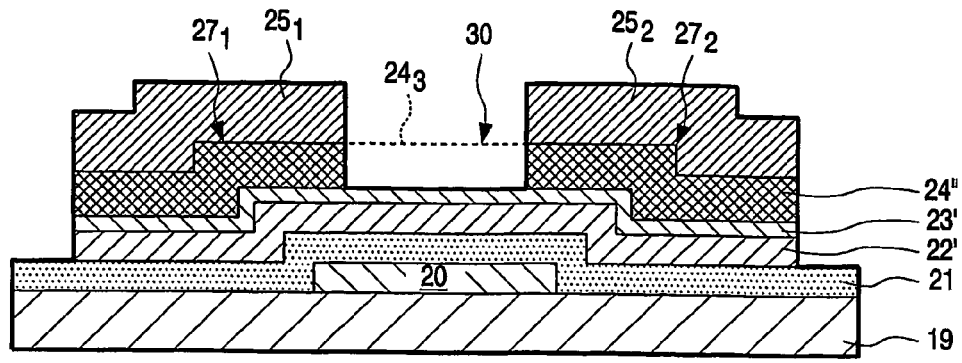

Referring to FIG. 4g, using a fourth dry etch, for example $SF_6/O_2$ or $CF_4/O_2$, the layer structure 4 in the third region 30 is etched. The etched metalisation layer 24' in the third region 30 is etched until the second semiconductor layer 23 is reached, thereby removing a third potion $24_3$ of the original metalisation layer 24 and leaving etched metalisation layer 24".

Figure 4H:
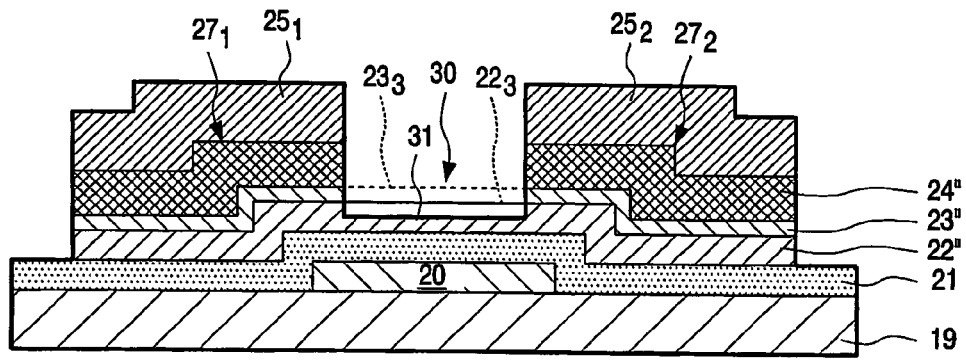

Referring to FIG. 4h, using a fifth dry etch, for example using $CF_4/O_2$ or $SF_6/O_2$, the layer structure 4 in the third region 30 is further etched. The second semiconductor layers 23 in the third region 30, thereby removing a third portion $23_3$ of the second semiconductor layer 23 and leaving etched second semiconductor layer 23". The first semiconductor layer 22 in the third region 30 is partially etched thereby removing a third potion $22_3$ of the first semiconductor layer 22 and leaving etched first semiconductor layers 22" including a channel 31.

Figure 4I:
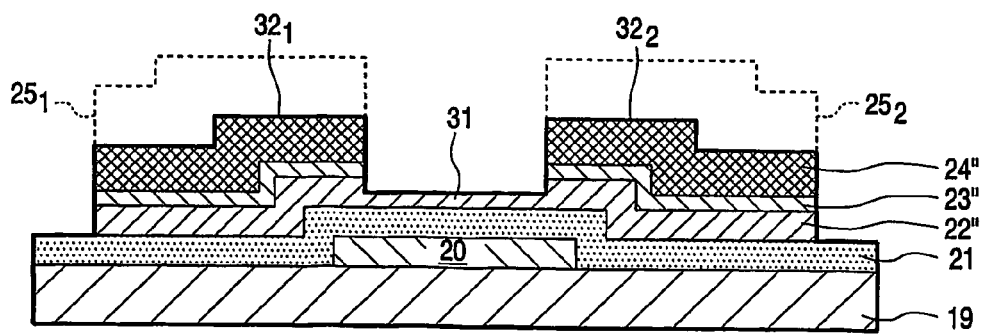

Referring to FIG. 4i, using a sixth dry etch, for example using $O_2$, the first patterned layer $25_1$, $25_2$ is removed so as to leave uncovered the first and second regions $27_1$, $27_2$ of the surface 26. Alternatively, instead of the third dry etch, a solvent may be used to remove (by dissolving) the first patterned layer $25_1$, $25_2$.

The etched second semiconductor layer 23" comprises first and second regions $32_1$, $32_2$ which form source and drain terminals respectively.

In this manner, source and drain terminals, $32_1$, $32_2$ and a channel 32 are formed using a simple fabrication process. The process is similar to using half-tone masking process in that an equivalent to a multi-level resist profile may be obtained.

In the described embodiment, both of the first and second patterned layers are printed. However, it is envisaged that the described printing techniques can be combined with known methods of forming thin film layers such as lithographic definition. For example, the first patterned layer may be printed, whereas the second patterned layer is formed using conventional lithographic definition employing deposition and patterning techniques.

From reading the present disclosure, other variations and modifications will be apparent to persons skilled in the art. Other printing means 2 may be used, such as an inkjet printer. Such variations and modifications may involve equivalent and other features which are already made in design, manufacture and use of electronic devices comprising thin-film transistors and component parts thereof and which may be used instead of or in addition to features already described herein.

The invention claimed is:

1. A method of fabricating a device, the method comprising:
   providing a layer structure;
   forming a first patterned layer onto a surface of said layer structure so as to mask a first region of said surface;
   forming a second patterned layer onto said surface layer of said layer structure so as to mask a second region of said surface and to leave unmasked a third region of said surface;
   etching said layer structure in said third region; and
   either removing said second patterned layer and etching said layer structure in said second region or
   removing said first patterned layer and etching said layer structure in said first region, wherein at least one of said first or second patterned layers is formed by printing.

2. A method according to claim 1, wherein both of the first and second patterned layers are formed by printing.

3. A method according to claim 2, wherein said printing of said second patterned layer comprises:

overlapping said second patterned layer with at least a portion of said first patterned layer.

4. A method according to claim 2, wherein said printing of said second patterned layer occurs substantially immediately following the printing of the first layer.

5. A method according to claim 2, comprising:
printing said first patterned layer having a first thickness and
printing said second patterned layer having a second, different thickness.

6. A method according to claim 2, comprising:
using a first ink for printing said first patterned layer and
using a second ink for printing said second patterned layer.

7. A method according to claim 6, wherein said first and second inks are different.

8. A method according to claim 6, wherein said first and second inks are diluted to different concentrations.

9. A method of fabricating a thin-film transistor according to claim 1.

10. A method according to claim 1, further comprising:
providing a substrate;
providing a patterned conductive gate region on said substrate;
providing a dielectric layer overlying said substrate and said patterned conductive gate region;
providing a first semiconductor layer overlying said dielectric layer;
providing a second semiconductor layer overlying said first semiconductor layer.
providing a metalisation layer overlying said second semiconductor layer.

11. A method according to claim 2, when said printing of said first layer includes defining regions for forming source and drain terminals.

12. Apparatus configured to perform the method according to claim 1.

13. An apparatus for fabricating a thin-film transistor, comprising:
printing means, said printing means configured to print a first patterned layer on a layer structure and a second, different patterned layer on a layer structure;
etching means, said etching means configured to etch said layer structure; and
removing means, configured either to remove said first patterned layer and to leave at least part of said second patterned layer, or to remove said second patterned layer and to leave at least part of said first patterned layer.

14. A method according to claim 3, wherein said printing of said second patterned layer occurs substantially immediately following the printing of the first layer.

15. A method according to claim 3, comprising:
printing said first patterned layer having a first thickness; and
printing said second patterned layer having a second, different thickness.

16. A method according to claim 4, comprising:
printing said first patterned layer having a first thickness; and
printing said second patterned layer having a second, different thickness.

17. A method according to claim 3, comprising:
using a first ink for printing said first patterned layer, and
using a second ink for printing said second patterned layer.

18. A method according to claim 4, comprising:
using a first ink for printing said first patterned layer; and
using a second ink for printing said second patterned layer.

19. A method according to claim 5, comprising:
using a first ink for printing said first patterned layer; and
using a second ink for printing said second patterned layer.

20. A method according to claim 7, wherein said first and second inks are diluted to different concentrations.

* * * * *